United States Patent
Chamberlain et al.

(10) Patent No.: US 6,289,116 B1
(45) Date of Patent: Sep. 11, 2001

(54) COMPUTER-ASSISTED DESIGN ANALYSIS METHOD FOR EXTRACTING DEVICE AND INTERCONNECT INFORMATION

(75) Inventors: George Chamberlain; Larry Lam, both of Ontario (CA)

(73) Assignee: Semiconductor Insights, Inc., Kanata (CA)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/939,047

(22) Filed: Sep. 26, 1997

Related U.S. Application Data

(60) Provisional application No. 60/026,820, filed on Sep. 27, 1996.

(51) Int. Cl.$^7$ .................................................. G06K 9/00
(52) U.S. Cl. ........................ 382/141; 382/140; 382/145
(58) Field of Search .................... 382/140, 141, 382/145, 147, 148; 348/87, 95, 96, 126; 356/237.5; 364/488, 489, 491, 490, 512

(56) References Cited

U.S. PATENT DOCUMENTS

| | | | |
|---|---|---|---|
| 4,001,840 | 1/1977 | Becker et al. | 346/76 L |
| 4,387,304 | 6/1983 | Younkin | 250/492.2 |
| 4,467,211 | 8/1984 | Smith et al. | 250/492.2 |
| 5,016,080 | * 5/1991 | Giannella | 357/45 |
| 5,086,477 | * 2/1992 | Yu et al. | 382/145 |
| 5,097,422 | * 3/1992 | Corbin, II et al. | 364/491 |
| 5,170,441 | 12/1992 | Mimura et al. | 382/165 |

(List continued on next page.)

OTHER PUBLICATIONS

Mital, Dinesh, "An Automatic Circuit Extractor From A Photo–Micrograph of Integrated Circuits," School of Electrical and Electronic Engineering, Nanyang Technological University, Singapore, IEEE TENCON'93/Beijing, pp. 319–323.

Barney, John, "Computer–Aided Reverse Engineering (CARE)* of ASICS: A New Way to Provide Test Vectors for Depot Repair Services and Create a New Source for Obsolete or Hard to Get Integrated Circuits," Bellevue, pp. 384–387.

Bafleur, et al., "Reliability Assessment of Integrated Circuits Through Reverse Engineering Techniques," Microelectronics Journal, vol. 17, No. 4, Luton, 1986, pp. 11–26.

Blythe, et al., "Layout Reconstruction of Complex Silicon Chips," IEEE Journal of Solid–State Circuits, vol. 28, No. 2, Feb. 1993, pp. 138–145.

Bourbakis, et al., "Specifications for the Development of an Expert Tool for the Automatic Optical Undrstanding [sic] of Electronic Circuits: VLSI Reverse Engineering," 1991 IEEE VLSI Test Symposium, 1991, pp. 98–103.

(List continued on next page.)

*Primary Examiner*—Matthew C. Bella
*Assistant Examiner*—Sheela Chawan
(74) *Attorney, Agent, or Firm*—Sterne, Kessler, Goldstein & Fox P.L.L.C.

(57) ABSTRACT

A method for extracting design information from a semiconductor integrated circuit (IC) or at least a portion thereof comprising the steps of: (a) imaging at least a portion of one or more IC layers to obtain stored images of said portions of the IC; (b) using manual or automatic registration techniques to mosaic images; (c) using an IC layout package possessing a feature of allowing images to be displayed and moved and polygons to be created to allow the recreation of the IC layout in the form of polygons; (d) exporting or storing of a polygon database in a standard IC layout format; (e) creating a table of transistor connections (netlist); (f) organizing circuit netlist into functional blocks of increasing complexity; and (g) generating a schematic diagram.

17 Claims, 1 Drawing Sheet

U.S. PATENT DOCUMENTS

| | | | |
|---|---|---|---|
| 5,191,213 | | 3/1993 | Ahmed et al. .......................... 250/310 |
| 5,258,919 | * | 11/1993 | Yamanouchi et al. ................ 364/489 |
| 5,463,561 | | 10/1995 | Razdan ................................. 364/489 |
| 5,541,849 | * | 7/1996 | Rostoker et al. ..................... 364/489 |
| 5,598,344 | * | 1/1997 | Dangelo et al. ...................... 366/488 |
| 5,638,291 | * | 6/1997 | Li et al. ............................... 364/488 |
| 5,689,432 | * | 11/1997 | Blaauw et al. .......................... 716/18 |
| 5,694,481 | * | 12/1997 | Lam et al. ............................ 382/145 |
| 5,751,596 | * | 5/1998 | Ginetti et al. ........................ 364/491 |
| 5,764,525 | * | 6/1998 | Mahmood et al. ................... 364/488 |
| 5,812,412 | * | 9/1998 | Moriizumi et al. ................... 364/488 |
| 5,812,416 | * | 8/1998 | Gupta et al. .......................... 364/490 |
| 5,818,727 | * | 10/1998 | Sekiguchi ............................. 364/488 |
| 5,820,561 | | 10/1998 | Olstad et al. ......................... 600/453 |
| 5,901,063 | * | 5/1999 | Chang et al. ......................... 364/578 |
| 5,905,654 | * | 5/1999 | Tanino et al. ........................ 700/103 |
| 5,943,487 | * | 8/1999 | Messerman et al. .................. 716/11 |

OTHER PUBLICATIONS

Kiang, Tan Ooi, et al., "Extracting Layers From Optical Images of Silicon Integrated Circuit Chips," Centre for Signal Processing, School of Electrical & Electronic Engineering, Nanyang Technical University, Singapore, pp. 571–575.

Kiang, Tan Ooi, et al., "Colour Image Segmentation of Layer Patterns on Silicon Integrated Circuit Chips," Centre for Signal Processing, School of Electrical & Electronic Engineering, Nanyang Technological University, Singapore, pp. 707–711.

Tan, et al., "An Automatic Layer Extractor of IC Chips," School of Electrical & Electronic Engineering, Nanyang Technological University, Singapore, pp. 1346–1349.

Gattiker, et al., "Visual Reverse Engineering Using SPNs for Automated Testing and Diagnosis of Digital Circuits," Binghamton University, Dept EE/AAAI lab, Binghamton, 1995, pp. 236–242.

Young–Uk Yu, "VLSI Design and CAD Technology in Korea," Valid Logic Systems, IEEE Design & Test of Computers, Oct. 1989, pp. 29–39.

Hild, et al., "Optical Preprocessing as Inspection Tool?," Optik 99, No. 3, 1995, pp. 123–133.

Khalaj, et al., "Digital Image Processing Techniques for Patterned Wafer Inspection," Information Systems Laboratory, Department of Electrical Engineering, Stanford University, SPIE, vol. 1926, pp. 508–516.

Yuan, et al., "A Production System for LSI Chip Anatomizing," Pattern Recognition Letters 5, North–Holland, 1987, pp. 227–232.

U.S. application No. 08/942,113, Chamberlain et al., filed Oct. 01, 1997.

* cited by examiner

COMPUTER-ASSISTED DESIGN ANALYSIS METHOD FOR EXTRACTING DEVICE AND INTERCONNECT INFORMATION

This application is a continuation of application Ser. No. 60/026,820 filed on Sep. 27, 1996.

This invention relates to the field of semiconductor integrated circuit structure analysis.

BACKGROUND Of THE INVENTION

In the intensely competitive field of microelectronics, detailed analysis of a semiconductor integrated circuit product can provide valuable information as to how a particular technical problem was dealt with, overall strengths and weaknesses of a design approach, etc. This information can be used to make decisions regarding market positioning, future designs and new product development. The information resulting from analysis of the product is typically provided through circuit extraction (reverse engineering), functional analysis and other technical means. At the core of this activity is the process of design analysis which, in this context, refers to the techniques and methodology of deriving complete or partial schematics, starting with essentially any type of integrated circuit in any process technology. For such technical information to be of strategic value it must be accurate and cost-effective, and it is very important that the information should be timely.

A design analysis process typically involves skilled engineers manually extracting circuit information from a set of large "photomosaics" of an integrated circuit (IC). Skilled technicians and engineers perform the following sequential manual tasks:

(1) Capture Image:
  (i) a high magnification photograph is taken, using a camera, of a small portion of an IC which has been processed to expose a layer of interest.
(2) step (i) is repeated for all of various regions of interest of the layer of the IC, ensuring that sufficient overlap exists between adjacent photographs that will be used to create photomosaics.
(3) Create Photomosaics:
  (ii) all adjacent photographs associated with the given IC layer are aligned and taped together.
(4) steps (1)–(3) are repeated for all layers (l)–(N) necessary to construct a layout database of the IC. All layers include interconnect layers. For example, four sets of photomosaics are required for a state-of-the-art microprocessor employing four layers of interconnect: three layers of metal and one layer of polysilicon.
(5) Extract Circuit:
  (iii) transistors, logic gates and other elements employed in the IC are identified by manually visually examining the polysilicon and lower metal interconnect photomosaics.
  (iv) interconnections between circuit elements of (iii) are traced and this information is captured in the form of schematic drawings.
  (v) drawings of (iv) are manually checked against the photomosaics and any obvious errors are corrected.
(6) Organize Schematic:
  (vi) the drawings of (v) are organized into hierarchial functional/logical blocks.
(7) Capture Schematic:
  (vii) the drawings of (vi) are entered into a computer using computer aided engineering (CAE) software tools for subsequent simulation and functional analysis of the IC.

Fully manual techniques for circuit extraction are not reliable since the task of extracting circuit information can be quite arduous and is prone to errors. Surprisingly, researchers have explored automated circuit extraction procedures instead of computer-assisted techniques. Because of the image processing techniques used to extract circuit information, the device must have excellent clarity on all the IC layers (i.e. no residuals from previous layers, and no stripping of the current layer). This is a heavy burden for the chemical etches used to prepare the samples (remove oxide, strip off IC layers, clean the sample, etc . . . )

Some systems have attempted to be fully automated, but no system has been designed to 'aid' the engineer in extracting the device and interconnect information. The prior art generally involves some sort of image processing or pattern recognition to identify the polygons which constitute the layout. Such systems are described in U.S. Pat. No. 5,086,477 issued Feb. 4, 1992 to Kenneth K Yu et al and U.S. Pat. No. 5,191,213 issued Mar. 2, 1993 to Haroon Ahmed et al. and also U.S. patent application Ser. No. 08/420,682.

In the system described in U.S. Pat. No. 5,086,477, the integrated circuit chip is scanned by a microscope or scanning electron microscope (SEM). The system identifies every unique cell and/or gate used in the integrated circuit. A unique abstract representation is created for each of these unique cells or gates, which are stored in a library.

However, without any operator guidance, the system cannot know where the boundary of a cell lies. While the patent suggests the use of diffusion edges to define cell boundaries, it appears that the only way that this can be done is by manual operator direction.

In the patented system, once all unique cells have been captured in a reference library. the system attempts to associate and match all abstract features contained in the layout data base to the cells in the reference library using classical template matching. However because of the magnitude of data contained in a layout data base for a typical modem integrated circuit, even after the data has been compressed, the processing time required to reliably extract a netlist is large. The difficulty and time required for the operator directed process becomes very difficult with a large number of cells or gates, since the number of template matching operations increases exponentially with the number of reference cells and/or gates.

Once all reference cells in the patented system have been template matched to the data base, theoretically all features in the layout data base will have been grouped and classified and a netlist can be constructed. If all the features of the layout data base have been classified then a netlist can be constructed. If there are features of the layout data base that have not been classified, either the system must construct a new cell or gate to be added to the reference library and an operator is informed, or the operator is informed by the system and the operator performs this task. The cell to cell interconnect information extraction, which is required to construct a netlist, is said to be performed using template matching, which is very inefficient.

Due to the template matching approach that is required, the patented system should be limited to gate-array or very structured standard cell integrated circuit analysis in which the large majority of the cells are identical, since as the number of cells in the integrated circuits increase, the efficiency decreases. It is therefore inefficient for analysis of modern ASICs or custom integrated circuits, large and/or complex integrated circuits. The patented system would also be limited to applications where many devices from a few ASIC manufacturers are investigated, due to the investment and time required to develop separate reference libraries, e.g. related to a different set of design rules.

U.S. Pat. No. 5,191,213 relates to a technique for removing layers of an integrated circuit and for scanning each of the layers.

U.S. Pat. No. 5,694,481 discloses a system which performs the following steps, in the following order: a) image capture; b) image segmentation and polygon generation; c) registering (of polygon data); d) vertical alignment; e) schematic generation. Although an improvement over the prior art this technique still has its limitations, some of them being:

1. Segmentation and polygon generation results are degraded around the boundaries of each of the images, which increased the amount of operator interaction. This could be minimized, by decreasing the perimeter to area ratio of the size of each image being captured. This minimizes the problem without solving the source
2. Registering of polygon data is not as precise as registering of images. Although a saving is generated in terms of computing time, operator time, especially at the vertical alignment phase, is increased.
3. Vertical alignment employes a potentially large search to align the different IC layers to each other. This search involves aligning sets of contacts and vias to each other from successive layers. This task could be hampered by a number of reasons:
   i. If deprocessing was poor, contacts/vias would not necessarily be easily replicated from layer-to-layer. Contacts/vias from successive layers may not necessarily be available.
   ii. The preferred embodiment of that invention used an SEM to perform image capture. Any SEM magnification drift could not be accommodated in the previous disclosure.
   iii. The search for a match could potentially be quite time consuming since no previous knowledge of a cross-reference point was available. Additionally, due to the often repetitive nature of integrated circuits, there was a chance of aligning the layers at the wrong location. If the 'layer misalignment' threshold was set too low, no match may be found.
4. No facility for correcting 'beam twist' in an SEM-like system is provided.

None of the previous techniques has the structure and advantages of the method included in the present invention.

SUMMARY OF THE INVENTION

The present invention overcomes the above shortcomings. A computer assisted circuit extraction method is proposed which counters these problems. In this disclosure, the overhead involved with 'tuning' the image processing algorithms and/or pattern recognition algorithms is removed, since the polygons are created manually.

The present invention is thus significantly more adaptable and the efficiency of layout extraction in respect of modem very large and complex integrated circuits is greatly improved.

In accordance with another object of the present invention there is provided a method for extracting design information from a semiconductor integrated circuit (IC) or at least a portion thereof comprising: (a) imaging at least a portion of one or more IC layers to obtain stored images of said portions of the IC; (b) using manual or automatic registration techniques to mosaic images; (c) using an IC layout package possessing a feature of allowing images to be displayed and moved and polygons to be created to allow the recreation of the IC layout in the form of polygons; (d) exporting or storing of a polygon database in a standard IC layout format; (e) creating a table of transistor connections (netlist); (f) organizing circuit netlist into functional blocks of increasing complexity; and (g) generating a schematic diagram.

In accordance with yet another object of the present invention there is provided a method for extracting design information from a semiconductor integrated circuit (IC) or at least a portion thereof comprising: (a) imaging at least a portion of one or more IC layers to obtain stored images of said portions of the IC; (b) using manual or automatic registration techniques to mosaic images; (c) using an IC layout package possessing a feature of allowing images to be displayed and moved and polygons to be created to allow the recreation of the IC layout in the form of polygons; (d) exporting or storing of a polygon database in a standard IC layout format; and (e) creating a table of transistor connections (netlist).

Further objects and advantages of the present invention will be apparent from the following description, wherein preferred embodiments of the invention are clearly shown.

BRIEF DESCRIPTION OF THE DRAWINGS

A better understanding of the invention will be obtained by reading the description of the invention below, with reference to the following drawings, in which.

DETAILED DESCRIPTION OF THE INVENTION

Figure 1:
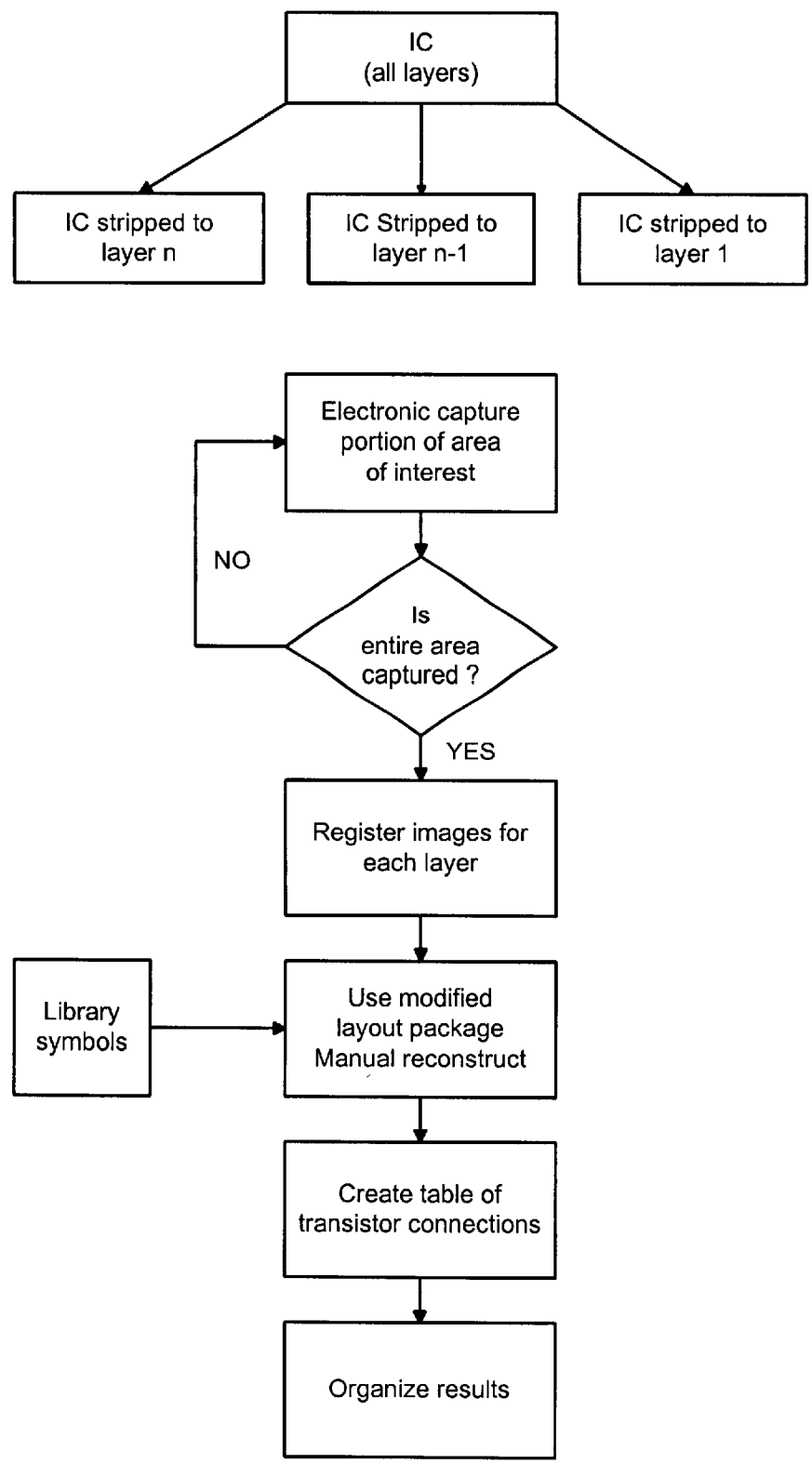
FIG. 1 is a flow chart generally illustrating the present invention of extracting design information from a pre-existing semiconductor integrated circuit (IC).

Based on the sophistication of the user and the level of automation desired, a few different system configurations are available—from no computer automation beyond the image display/manual image movement/polygon drawing/printing to a system which performs these tasks with the added features of automated image placement and netlist generation. Optionally, signal tracing capabilities can be added. In all cases the user has the option of generating specialized symbols which are recognized by the netlist tool as primitive functions (i.e. transistor, inverter etc.). These are just IC layout format cells which either a netlist tool can recognize, or a symbol which the engineer is more familiar with. The layout format being generally GDSII.

To the operator, the symbols that are being placed are considered primitive. However, below each symbol is actual layout information which can be interpreted by industry standard netlist tools (which netlist tools can be of the Verilog or Spice or VHDL type). The symbols may have, underneath them, a layout as simple as a single transistor (either n- or p-type) or even as complicated as a flip-flop, a mexnory array or any other layout entity which is repeated multiple times in a layout. The symbols have ports on them which the operator would use to interconnect each symbol with the other symbols which have been placed using the standard IC layers. The route and IC layer which the operator uses to interconnect each of the symbols does not necessarily need to correspond with the type/routing of the interconnection which is physically used in the layout, although this may often be the case. For example, even when extracting circuit information from a circuit which was fabricated using a two-layer metalization process, any number of metalization layers, even 6 or more, could be used to mimic the interconnections of the symbols as long as the netlist tool recognizes these extra layers of metalization and the electrical connectivity of the circuit is preserved.

It should also be mentioned that transistor sizing can be extracted from the polygons which are generated through the process, the true accuracy of the sizings being dependant on the type of imaging used.

The advantage of this method over current technologies, is that no facility exists which incorporates all these components. Tools are available to manipulate pixel images (and even include overlays), but none exist which can output data in IC industry standard formats. In summary, IC tools are inadequate for performing this task since they do not have the facility to view/manipulate pixel data and more generic image manipulation tools are also inadequate because they are customized for document presentation, and do not provide the facility to perform complicated manipulations with polygon data (i.e. extract relative positioning information, boolean intersections etc.).

The method flow could be as follows:
1. Image device IC layers individually. Transistor polysilicon and diffusion areas can be imaged together. If the device is simple (i.e. one metal, one polysilicon)—only one set of images may be necessary;
2. Optionally use pixel based registration techniques to mosaic the images. A facility must exist for an operator to manually move the pixel images. This is required if the operator decides to mosaic the images manually, or detects a mis-registration produced by the automated techniques;
3. Use a package similar to an IC layout package which allows the drawing, and extraction of positions, of polygons over the images. The package must allow the user to toggle which set of background images should be displayed (2nd layer metal, 1st layer metal, etc.). Optionally, each set of background images can be moved and rotated with respect to a fixed point in the database. Also, optionally, basic building blocks such as NMOS, PMOS, NPN, PNP transistors, resistors, capacitors, diodes, inductors etc. can be placed instead of drawing components explicitly. Additionally, optional building blocks such as simple logic gates, or even complicated structures can be placed directly as well. These blocks can be in the form of schematic symbols which an engineer would be familiar with and/or physical layout symbols, which the computer can interpret.
4. The optional facility to either export the polygon database in a standard IC layout format, such as GDSII, and/or the facility to create a table of transistor connections netlist can be present. It should be noted that a new, more compact, netlist may be generated following the organizing since it can then utilize the results of the circuit organization;
5. The optional facility to create functional blocks of increasing complexity in the netlist can be available. This includes the facility to recognize standard logic functions, or higher-level patterns of organization.

The techniques outline above are similar to flow used to lay an IC out. The difference, in this case, is that the operator re-creates the IC layout, using the digital representations of the physical IC as a guide. Using these techniques, even large circuit areas of an IC can be extracted.

It should also be noted that the step of organizing the circuit netlist into functional blocks of increasing complexity and the step of generating a schematic diagram may not be necessary when dealing with small areas.

The invention may be embodied in other specific forms without departing from the spirit or essential characteristics thereof The present embodiments are therefore to be considered as illustrative and not restrictive, the scope of the invention being indicated by the appended claims rather than by the foregoing description, and all changes that come within the meaning and range of equivalency of the claims are therefore intended to be embraced therein.

The embodiments of the invention in which an exclusive property or privilege is claimed are defined as follows:

1. A method of extracting design information from a pre-existing semiconductor integrated circuit (IC), or at least a portion thereof, comprising the steps of:
   a. imaging at least a portion of one or more physical layers of the pre-existing IC to obtain stored images of the physical IC layers;
   b. manually drawing polygons over the stored images of the physical IC layers of the pre-existing IC using an IC layout package to recreate an IC layout in the form of a polygon database;
   c. exporting or storing the polygon database in a standard IC layout format; and
   d. creating a netlist using the polygon database to represent the pre-existing IC.

2. The method of claim 1, wherein step (b) includes manually placing specialized symbols over a pattern in the stored images of the physical IC layers, the specialized symbols being recognizable by a netlist tool and having a shape representative of a corresponding electrical function.

3. The method of claim 2, wherein the specialized symbols represent basic electronic components.

4. The method of claim 3, wherein the basic electronic components comprise at least one of: an NMOS transistor, a PMOS transistor, an NPN transistor, a PNP transistor, a resistor, a capacitor, and inductor and a diode.

5. The method of claim 3, wherein the specialized symbols are in the form of schematic symbols.

6. The method of claim 3, wherein the specialized symbols are in the form of physical layout symbols.

7. The method of claim 2, wherein step (b) includes manually drawing interconnections between polygons and the specialized symbols.

8. The method of claim 2, further comprising the steps of:
   e. organizing the netlist into functional blocks of increasing complexity; and
   f. generating a schematic diagram using the netlist.

9. The method of claim 2, wherein the IC layout format is GDSII.

10. The method of claim 2, wherein the netlist is compatible with at least one of Verilog, Spice and VHDL.

11. The method of claim 2, wherein the stored images of the IC layers are a corresponding set of background images displayed using the IC layout package and wherein step (b) includes toggling between the IC layer background images.

12. The method of claim 2, wherein the stored images of the IC layers are a corresponding set of background images displayed using the IC layout package and wherein step (b) includes moving the background images relative to a fixed point in the polygon database using the IC layout package.

13. The method of claim 2, wherein the stored images of the IC layers are a corresponding set of background images displayed using the IC layout package and where step (b) includes rotating the background images relative to a fixed point in the polygon database using the IC layout package.

14. A method of extracting design information from a pre-existing semiconductor integrated circuit (IC), or at least a portion thereof, comprising the steps of:
   a. imaging at lest of a portion of one or more physical layers of the pre-existing IC to obtain stored images of the IC layers;

b. mosaicking the stored images of each IC physical layer using a registration technique;

c. recreating an IC layout in the form of a polygon database using an IC layout package including one or more of the following:

i. manually placing specialized symbols over a pattern in the stored images of the physical IC layers for storage in the polygon database, the specialized symbols being recognizable by a netlist tool;

ii. manually drawing polygons over other elements of the stored images of the physical IC layers for storage in the polygon database; and iii. manually drawing interconnections between polygons and the specialized symbols for storage in the polygon database;

d. exporting or storing the polygon database in a standard IC layout format;

e. creating a netlist using the polygon database;

f. organizing the netlist into functional blocks of increasing complexity; and g. generating a schematic diagram using the netlist.

15. The method of claim 14, wherein the stored images of the IC layers are a corresponding set of background images displayed using the IC layout package and wherein step (c) includes one or more of the following:

a. toggling between the IC layer background images;

b. moving the background images relative to a fixed point in the polygon database using the IC layout package, and c. rotating the background images relative to a fixed point in the polygon database using the IC layout package.

16. A method of extracting design information from a pre-existing semiconductor integrated circuit (IC), or at least a portion thereof, comprising the steps of:

a. imaging at least a portion of one or more physical layers of the pre-existing IC to obtain stored images of IC physical layers;

b. manually drawing polygons over the stored images of the physical IC layers using an IC layout package to recreate an IC layout in the form of a polygon database;

i. displaying the stored images of the physical IC layers as a set of background images using the IC layout package;

ii. toggling between the background images;

iii. moving the background images relative to a fixed point in the polygon database using the IC layout package; and iv. rotating the background images relative to a fixed point in the polygon database using the IC layout package;

c. exporting or storing the polygon database in a standard IC layout format; and d. creating a netlist using the polygon database.

17. The method of claim 16, further comprising the step of:

e. manually placing specialized symbols over a pattern in the stored images, the specialized symbols being recognizable by a netlist tool and having a shape representative of a corresponding electrical function.

* * * * *